United States Patent [19]

Winter

[11] 4,410,392

[45] Oct. 18, 1983

[54] PROCESS FOR RESTRUCTURING THIN STRIP SEMI-CONDUCTOR MATERIAL

[75] Inventor: Joseph Winter, New Haven, Conn.

[73] Assignee: Olin Corporation, New Haven, Conn.

[21] Appl. No.: 245,009

[22] Filed: Mar. 18, 1981

Related U.S. Application Data

[63] Continuation-in-part of Ser. No. 194,539, Oct. 6, 1980, Pat. No. 4,356,861.

[51] Int. Cl.$^3$ .............................................. C30B 1/02
[52] U.S. Cl. ............................ 156/603; 156/DIG. 88
[58] Field of Search ....... 156/603, DIG. 88, DIG. 73, 156/617 H, 608

[56] References Cited

U.S. PATENT DOCUMENTS

| | | |
|---|---|---|
| 2,686,864 | 8/1954 | Wroughton et al. |
| 3,023,091 | 2/1962 | Smith |
| 3,027,281 | 3/1962 | Osborn et al. ........................ 156/603 |
| 3,096,158 | 7/1963 | Gaule et al. |
| 3,429,818 | 2/1969 | DiBenedetto et al. ............. 252/62.9 |
| 3,467,166 | 9/1969 | Gtselev et al. ......................... 164/49 |
| 3,585,088 | 6/1971 | Schwuttke et al. ................. 156/603 |
| 4,161,206 | 7/1979 | Yarwood et al. ..................... 164/49 |
| 4,248,645 | 2/1981 | Tewett ......................... 156/DIG. 73 |
| 4,323,419 | 5/1980 | Wakefield ............................ 156/622 |

OTHER PUBLICATIONS

National Technical Information Service Report PB-248,963, "Scale-Up of Program on Continuous Silicon Solar Cells" by A. D. Morrison, Sep. 1975.

"The Role of Surface Tension in Pulling Single Crystals of Controlled Dimensions" by G. K. Gaule et al. from *Metallurgy of Elemental and Semiconductors*, published by Interscience Publishers, Inc., New York, 1961, pp. 201–226.

*An Introduction to Semiconductors*, by W. Crawford Dunlap, Jr., published by John Wiley & Sons, 1957.

*Zone Melting* by William G. Pfann, published in 1958 by John Wiley & Sons, Inc.

"Laser Growth of Silicon Ribbon" by Gurtler and Baghdadi from *Laser*.

*Primary Examiner*—Hiram H. Bernstein
*Attorney, Agent, or Firm*—Howard M. Cohn; Barry L. Kelmachter; Paul Weinstein

[57] ABSTRACT

A process for restructuring thin strip semiconductor material is disclosed. It comprises the steps of providing relative movement between the thin strip material and the heating station. The thin strip material is heated at the heating station to a desired temperature between the recrystallization temperature and the melting temperature. The strip is maintained at the desired temperature whereby preferred recrystallization and stress relief occurs within the material. In addition, the thin strip material may be elongated through elevating the temperature of the thin strip and/or increasing the longitudinal tension on the strip.

10 Claims, 4 Drawing Figures

PROCESS FOR RESTRUCTURING THIN STRIP SEMI-CONDUCTOR MATERIAL

This application is a continuation-in-part of United States Patent Application No. 194,539 to Joseph Winter filed Oct. 6, 1980 now U.S. Pat. No. 4,356,861, Nov. 2, 1982.

While the invention is subject to a wide range of applications, it is especially suited for use in recrystallization and stress relief of thin strip semi-conductor material and wil be particularly described in that connection. The process is applied to existing strip material in order to provide single crystal or preferred polycrystalline thin strip material with substantial stress relief within the material. In addition, the process provides reduced thickness of the original strip material.

A variety of processes have been developed for forming semi-conductive materials such as silicon into a thin strip shape. Examples of such approaches can be found in National Technical Information Service Report PB-248,963 "Scale Up of Program on Continuous Silicon Solar Cells" by A. D. Morrison, published in September 1975, and a paper entitled "The Role of Surface Tension in Pulling Single Crystals of Controlled Dimensions" by G. K. Gaule et al. from Metallurgy of Elemental and Compound Semiconductors, published by Interscience Publishers, Inc., New York in 1961, pages 201-226. The Morrison publication is exemplary of the state of the art with respect to the pulling of strip-type materials from a melt of silicon. The Gaule et al. publication is similarly exemplary and of particular interest insofar as it discloses the use of electromagnetic forces for applying external pressure at the growth interface.

The material produced by Morrison is subject to substantial crystallographic defects as described on pages 84-86 of the publication. One of the intents of the present invention is to provide a process which can reform the strip produced by any known method into a strip having improved crystal structure.

A considerable body of art has developed with respect to the use of electromagnetic containment for the purposes of casting metals. Such electromagnetic casting apparatuses comprise a three-part mold consisting of a water cooled inductor, a non-magnetic screen, and a manifold for applying cooling water to the resultant casting. Such an apparatus is exemplified in U.S. Pat. No. 3,467,166 to Getselev et al. Containment of the molten metal is achieved without direct contact between the molten metal and any component of the mold. Solidification of the molten metal is achieved by the direct application of water from a cooling manifold to the solidifying shell of the casting. An elaborate discussion of the prior art relating to electromagnetic casting is found in U.S. Pat. No. 4,161,206 to Yarwood et al. That prior art statement is intended to be incorporated by reference herein. The Yarwood et al. patent itself deals with a control system for controlling the electromagnetic process which is believed to have particular use in the apparatus of the present invention.

In U.S. Patent Application Ser. No. 139,617, filed Apr. 11, 1980 by M. J. Pryor, an electromagnetic thin strip casting apparatus and process is described which is adapted for forming thin strip castings of a variety of materials including semi-conductive materials such as silicon. A specially-shaped inductor is utilized for containing a funnel-shaped pool of molten material and for forming the material into the desired thin strip shape. The process can be carried out continuously or semi-continuously as desired.

In U.S. Patent Application Ser. No. 158,040, filed June 9, 1980, by J. Winter, an electromagnetic thin strip reforming apparatus and process is described which is adapted for forming thin strip castings of a variety of materials including semi-conductive materials such as silicon. An input device conveys the starting strip of material to the electromagnetic apparatus to form the floating molten zone.

U.S. Pat. No. 3,429,818 to DiBenedetto et al. discloses for example, a "method of growing a solid solution single crystal combining selected compounds involving passing a zone of matter solvent through a selected crystalline feed material by the process of dissolution and recrystallization under conditions such that the feed material which enters the solvent as solute recrystallizes out of the solvent onto a selected seed crystal in the form of a solid solution single crystal".

Additional processes have been developed for growing crystals in semi-conductive materials such as silicon. Examples of such approaches can be found in *An Introduction to Semiconductors* by W. Crawford Dunlap, Jr., published by John Wiley & Sons in 1957 and Zone Melting by William G. Pfann, published in 1958 by John Wiley & Sons, Inc. On page 215 of Dunlap's book, the floating-zone method is described for growing crystals of reactive materials which keeps the molten material completely out of contact with solid containers. The crystal is first made in the form of a rod of a small size. Then, r-f heating is used to produce a thin liquid zone in the vertical rod. The zone is held in place by surface tension, and thus the diameter must be rather small. By seeding the initial melt with a single crystal, the floating-zone method serves to grow single crystals. This concept differs from the present invention in that only the surface of the thin silicon strip of the present invention is in the molten state as it passes through the inductor. The Pfann reference (pages 82-92) also discloses a single crystal of silicon being grown by a floating-zone technique. This concept differs from the present invention in that there is a molten zone located and held in place by its own surface tension between two solid rods. In the present invention, the silicon is preferably in a thin strip form, is not molten, and may be continuously drawn through an electromagnetic inductor.

A further process for growing crystals in silicon is described in an article entitled "Laser Growth of Silicon Ribbon" by Gurtler and Baghdadi from *Laser Applications in Materials Processing*, published by the Society of Photo-optical Instrumentation Engineers, Bellingham, Washington in 1980, pages 128-132. Recrystallization and thermal stress control of poly-silicon ribbons being changed into large grained ribbon requires controlled thermal environment in addition to laser recrystallization. As in the above-mentioned crystal growing technique, a very small molten zone is created between solid regions on the top and bottom of the zone.

Although there is prior art developing the technique of electromagnetic melting containment and forming of thin strip material such as silicon, a number of problems still remain. For instance, the production of thin strip material may result in the formation of high stresses introduced by the thermal solidification forces. Also, there are probably problems with the formation of single crystal or highly preferred crystal structures of the material which may be extremely important due to the end use of the thin strip material. In addition, it may be difficult to provide uniform thickness of the final strip in conjunction with the preferred structure.

It is a problem underlying the present invention to provide thin strip semi-conductor material without substantial internal stresses and with preferred crystal structure.

It is an advantage of the present invention to provide a method for restructuring thin strip semi-conductor material which substantially obviates one or more of the limitations and disadvantages of the described prior arrangement.

It is a further advantage of the present invention to provide a process for restructuring thin strip semi-conductor material whereby preferred crystal structure is developed in the thin strip material.

It is a further advantage of the present invention to provide a process for restructuring thin strip semi-conductor material wherein internal stresses have been relieved.

It is a yet further advantage of the present invention to provide a process for restructuring thin strip semi-conductor material wherein the thickness of the resulting material may be controlled.

It is a still further advantage of the present invention to provide a process for restructuring thin strip semi-conductor material which is relatively economical and easy to operate.

Accordingly, there has been provided a process and apparatus for converting material in strip form to structurally and dimensionally controlled ribbon or strip suitable for electronic applications such as solar cells. The starting strip material can be the product of any known process and apparatus for forming such material. The starting strip can comprise: castings; compressed and sintered powders; high solidification rate formed amorphous strip; the strip formed by Morrison or Gurtler et al. as described in the background of this application; or any other desired strip. The strip material may be formed of any desired semi-conductor material such as silicon or germanium or any other desired material to which this process may be beneficially applied.

The starting strip material is initially preferably supported in the form of a coil. The strip material is paid off the coil and fed through an electromagnetic heating station. In the heating station, the initial strip material is locally heated to a desired temperature between the recrystallization temperature and the melting temperature. The strip material is maintained at the desired temperature in the electromagnetic heating station in order to provide preferred crystal structure and stress relief in the resultant product which can then be coiled in a conventional fashion.

By optionally controlling the relative speeds at which the initial strip is paid off and the final strip is coiled up, it is possible to control the thickness of the final strip. It is only necessary that there be relative movement between the strip and the heating station. Preferably, the strip is advanced past a fixed heating station. However, if desired, the heating station could be moved along the strip. Further, preferably the process is carried out generally continuously utilizing strip material in coiled form although the process is clearly applicable to strip materials in other than coil form.

The invention and further developments of the invention are now elucidated by means of preferred embodiments shown in the drawings.

Figure 1:
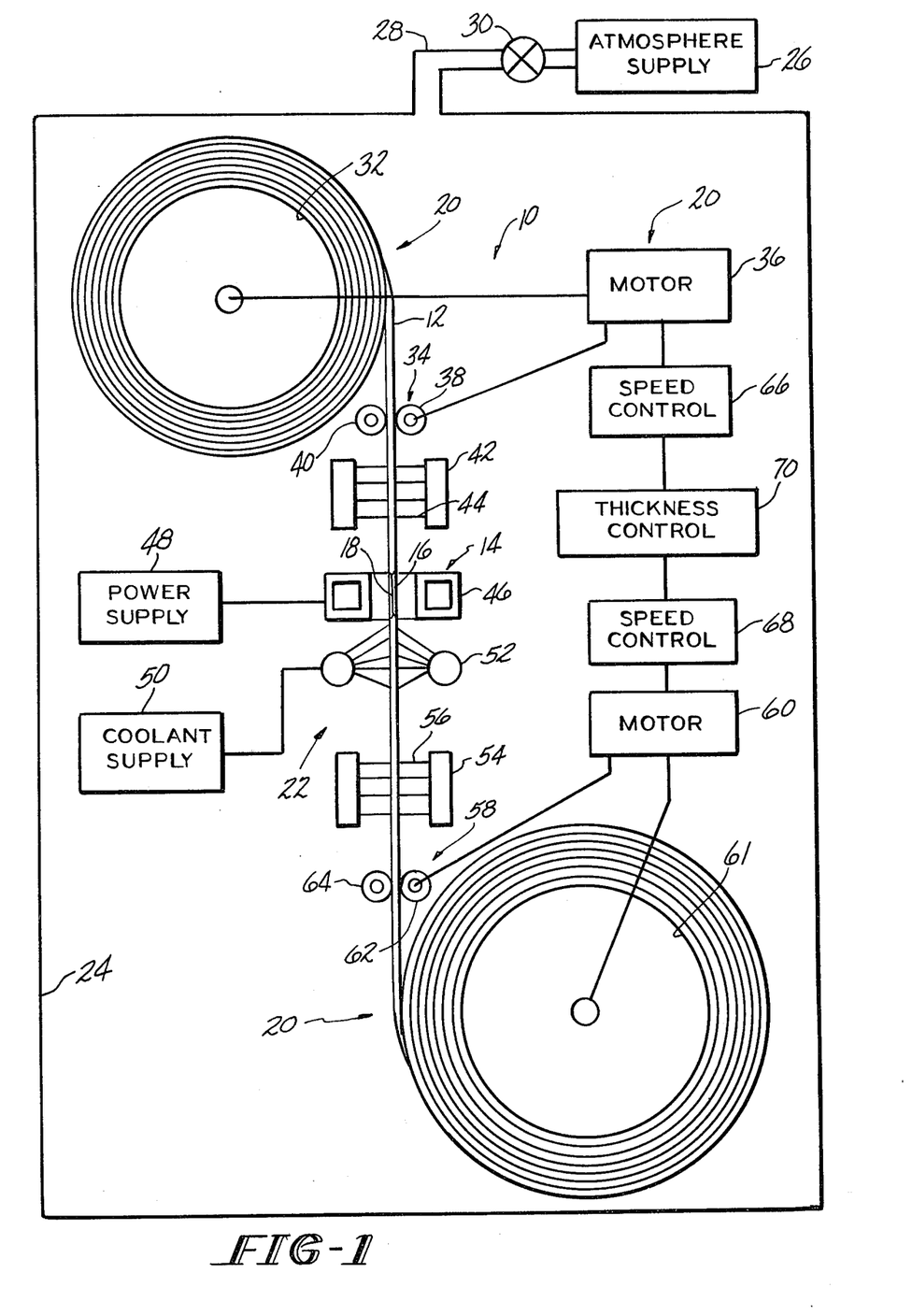
FIG. 1 is a schematic representation of an apparatus in accordance with the present invention.

Referring to FIG. 1, an apparatus 10 is provided for recrystallization of thin strip material 12 in accordance with a first embodiment of the present invention. The apparatus includes a device 14 for electromagnetically melting the thin strip material 12 to provide a molten surface layer 16 and a substantially solid core 18. The apparatus 10 includes a device 20 for providing relative movement between the thin strip 12 and the device 14 for electromagnetically melting. Also, structure 22 is provided for resolidifying the molten surface layer to provide a preferred crystal structure in the thin strip material.

A process is provided for producing ultra-thin strip cross sections from a starting strip material having improved microstructure and improved dimensional uniformity. The invention may be adapted for use with a starting material in the form of ribbon or strip preferably available in long coils. The starting strip can be obtained by casting as in accordance with the Pryor application mentioned in the background of this case; from metal powder compressed and sintered to yield coils of sufficient integrity to be handled; from ribbon strip produced by the high solidification rate amorphous strip processes; from strip produced by the crystal pulling techniques as in the Morrison or Gurtler et al. articles or from strip produced by any other desired method.

In accordance with one embodiment of this invention, it is desired to provide strip of very uniform dimension, particularly thickness. It is further desired to provide structurally controlled strip preferably having a large grain size with a minimum number of grain boundaries and most preferably having a single crystal or nearly single crystal morphology. The process of the present invention is adapted for obtaining preferred grain growth to thereby yield desired structure control.

The desirable characteristics of a thin strip material having a single crystal or as large a grain size as possible may be derived by surface melting of the thin strip so that a solid substrate or core remains. The core provides a surface upon which the molten surface can resolidify under controlled conditions. To understand the present invention, refer to FIG. 2 which illustrates a curve 11 reflecting a time-temperature relationship of a pure material. The relationship holds as a function of either heating or cooling through the melting point. The curve assumes only constant heat input and losses. Therefore, the slope 13 of the upper portion of the curve is primarily a function of the specific heat of the liquid. Likewise, the slope 15 of the lower portion of the curve is a function of the specific heat of the solid. The points L and S at the ends of the middle portion 17 of the curve reflect the liquidus and solidus, respectively. This horizontal portion 17 between L and S is isothermal for pure materials. The length of the isotherm between these two points is a function of the heat of fusion of the material being considered. The present invention is directed preferably to materials having a relatively long isotherm such as semi-conductors. For purposes of this specification, the material described is silicon, but the invention can be applied and includes any metal, alloy, metalloid, semi-metal, or any other material which can be operated upon in terms of the inventive concept. The specific intention of the invention is to use the long isotherm as constant heat input to alter the thin strip material to have preferred crystal structure.

Figure 2:
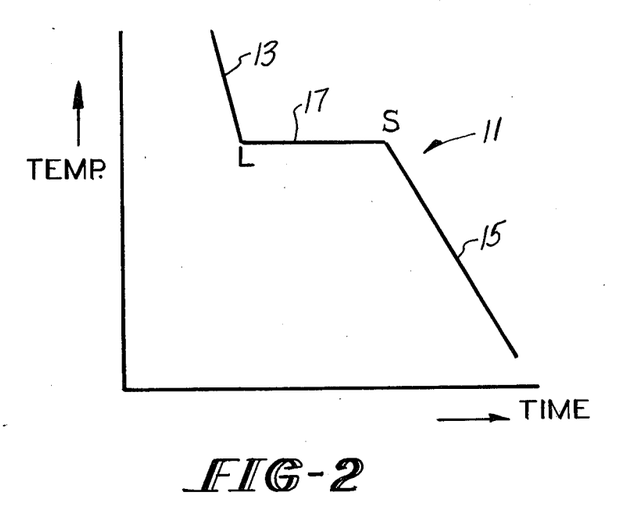
FIG. 2 is an illustration of a time-temperature relationship of a pure material.
Figure 3:
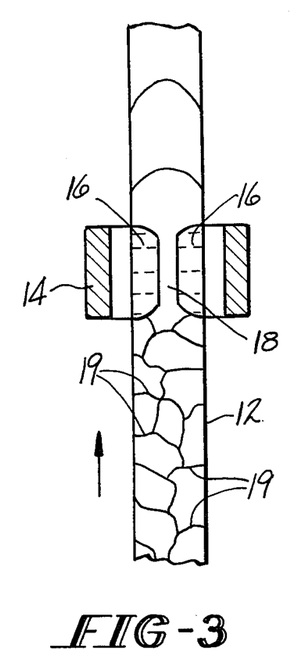
FIG. 3 is a representation of a thin strip of material passing through an electromagnetic casting device of the present invention.

This can be more fully understood by referring to FIG. 3 which is a schematic illustration of a thin strip material 12, such as silicon moving through an electromagnetic device 14. The incoming portion of the thin strip has a polycrystalline structure indicated by the grain boundary lines 19. The incoming portion of the thin strip may be initially heated by any desired means such as the heat from the portion of the strip already within the inductor being conducted upstream towards the colder portion of the thin strip being fed into the inductor. It is also within the scope of the present invention to preheat the material by additional induction heaters, r-f heaters, or any other type of suitable heating system. At this point, the silicon is in the lower portion 15 of the curve 11. As the thin strip enters the device 14, a molten surface layer 16 is formed on the surface of the thin strip in the area surrounded by electromagnetic device 14. The inductor is designed to only melt a surface layer of the thin strip and leave a substantially solid core 18. The depth of the molten surface may be determined by the power level of the inductor in conjunction with the speed in which the thin strip moves through the inductor. Referring to FIG. 2, the molten surface and the solid core are represented by the isotherm 17 between L and S and are at approximately 1430° C. for silicon. Thus, the solid core is at an elevated temperature, at approximately its melting point, and is undoubtedly plastic.

At this stage, the grain boundaries in the core become mobile due to the thermal energy provided in the thin strip. The grain boundary mobility may be improved by the temperature gradients and external forces such as the strain created by the thin strip being pulled through the inductor. At first, the grain boundaries in the core may migrate in the short transverse direction of the strip and dissipate into the molten surface layer to create a crystal structure or a single crystal through the transverse cross section of the solid core or substrate. This initial movement is due to the tendency of the material to go to the lowest thermodynamic energy level and naturally occurs in the transverse cross section of the thin strip. Next, given enough time and suitable conditions, the grain boundaries begin to migrate along the thin strip core in the longitudinal direction.

After the thin strip leaves the electromagnetic field of the inductor, resolidification of the molten surface occurs. The crystal structure grows epitaxially on the residual solid core since the solid core represents the most thermodynamically stable nucleus for transformation from liquid to solid. In the most preferred case, the resulting thin strip is a single crystal material. Otherwise, the thin strip may consist of single crystals in transverse cross section of the thin strip. A more detailed description of the apparatus and process of forming this thin strip having a single crystal or nearly single crystal morphology is described hereinbelow.

Referring now to FIG. 1, an apparatus 10 is shown which is adapted for carrying out the process of the present invention. The apparatus 10 shown may be contained within an atmosphere controlled chamber 24 where the process can be performed with a reduced possibility of contamination. It is within the scope of the present invention to use any suitable atmosphere such as for example argon gas. The atmosphere is provided from a suitable atmosphere supply 26 which is connected to the processing chamber 24 by conduit 28 and valve 30. The atmosphere supply 26 can be of conventional design and does not form a part of the present invention.

Within the processing chamber is supported a first payoff reel 32 of the starting thin strip material 12. A first capstan drive 34 is arranged adjacent the payoff reel 32 for controlling the rate of speed at which the starting strip material 12 is paid off the payoff reel 32. The capstan drive 34 may be gear driven by motor 36 whose speed may be controlled in a manner which will be described hereinbelow. The capstan drive 34 may comprise opposed driven and idling pinch rolls 38 and 40, respectively. The payoff reel 32 may also be gear driven by motor 36 through a slip clutch (not shown) at a relatively slower speed than the capstan drive 34. This speed differential advances the strip 12 to provide a slight tension on the strip 12 between the payoff reel 32 and the capstan drive 34. The strip 12 from the payoff coil is threaded through the nip of the capstan drive rolls and then through a first guide device 42 which is adapted to guide the strip 12 into the processing station 14 of the present invention. The guide device 42 may be of any conventional design. It may comprise rollers, slides, or brushes 44 as shown. The brushes 44 are preferably formed of an inert material which will not contaminate the strip 12 and which is heat resistant. A suitable material may comprise fibers of polytetrafluoroethylene.

The strip 12 is then forwarded into a containment and melting station 14. Although the heating process may be achieved by direct heat flux deriving from plasma-arc, direct radiation, lasers, electron beams, etc., the preferred process is high frequency induction heating. Thus, in accordance with this invention, an electromagnetic containment and melting station 14 is provided with an inductor 46. The inductor is powered by supply 48 at a level to form a molten surface zone 16 and a substantially solid core 18 from the initially solid thin strip 12. The inductor 46 can also contain and form the molten material into the final desired strip cross section. While it is preferred to use an inductor 46 for simultaneously forming and containing the molten material and for providing the necessary heat input to melt the surface of the incoming strip, it is within the terms of the present invention for the melting operation to be provided by a separate heating source such as another inductor, a laser, or any other desired heat input system. In addition, additional heating sources may be provided upstream of the station 14 to heat the strip up to a temperature below the melting point.

A suitable coolant, from coolant supply 50, may be applied by spray manifold 52 to the resulting strip after the strip passes through the containment inductor 46. The coolant may comprise any desired coolant material such as argon gas or water. The coolant can be gaseous or liquid as desired. The use of an inert gas may be advantageous when the rate at which the strip advances is relatively slow as might be the case for the preferred single crystal growth of the present invention. The use of water is more suited to high speed travel of the strip.

The solidified strip is then passed through a second guide device 54 constructed of brushes 56 in a manner similar to that of the first guide 42.

A second capstan drive 58 is arranged adjacent a takeup reel 60 for controlling the rate of speed at which the resulting strip material passes through the electromagnetic casting station 14. The capstan drive 58 may be gear driven by motor 60 whose speed may be controlled in a manner which will be described hereinbelow. The capstan drive 58 also comprises opposed driven and idling pinch rolls 62 and 64, respectively. The strip is threaded through the nip of the capstan pinch rolls and then onto the takeup reel 61. The takeup reel 61 may also be gear driven by motor 60 through a slip clutch (not shown) at a relatively higher speed than the capstan drive 58 advances the strip to provide a slight tension on the strip between the takeup reel 61 and the capstan drive 58.

For brittle materials, such as silicon, the reels 32 and 61 may be relatively large in diameter so as not to exceed the flexibility of material. However, with thin strip materials, to which this invention is principally applicable, it is possible to coil and uncoil even brittle materials on large diameter reels 32 and 61.

The thickness of the resulting thin strip of material is a function of the rate at which the incoming strip 12 is fed to the melting and containment station 14 and the exiting solidifying strip is withdrawn from that station 14. These rates are controlled by the aforenoted motors 36 and 60 and capstan drives 34 and 58 whose speeds are in turn controlled by a conventional speed control 66 or 68, respectively. The speed control 66 or 68 may in turn be actuated by a thickness control system 70. The thickness control system can comprise a conventional switch bank arrangement wherein a plurality of selectable speed levels can be selected for each motor 36 or 60 through speed controls 66 or 68, respectively. By varying the ratio of the speed of the payoff capstan 34 versus the takeup capstan 58, it is possible to either maintain the thickness of the incoming strip, reduce the thickness of the strip, or if desired, even increase the thickness of the strip. If it is desired to maintain a given thickness of the strip, compromising the approximate average thickness of the incoming strip 12, then the incoming strip is advanced through the melting and containment zone or device 14 at the same rate as the strip exits therefrom. If it is desired to thin the incoming strip and provide a thinner resulting strip, then the takeup capstan is driven so that the strip leaving the containment zone 14 exits at a speed greater than the speed of the incoming strip. This causes the solid web or core, which is flexible, to stretch while the electromagnetic field forms the molten material to the desired thickness. Similarly, if it is desired to increase the thickness of the incoming strip, then the speed of the strip leaving the melting and containment station 14 is controlled to be slower than the speed of the strip entering station 14. In this manner, it is possible to control the thickness of the resulting strip by controlling the relative speed at which the strip is withdrawn from the containment station as compared to the speed at which the strip enters the containment station.

The thickness control system accomplishes this by setting a desired operational speed for each of the motors 36 and 60. The thickness control system 70 may comprise any desired arrangement for selectively controlling the ratio of speeds of the motors 36 and 60 to provide the desired input and output speeds of the strip 12 with respect to station or zone 14. Further, it is possible, in accordance with this invention, for the thickness control system 70 to utilize a computer which automatically regulates the speed controls 66 and 68 to drive the motors 36 and 60 at the desired speeds for achieving a given thickness in the final thin strip product.

The inductor 22 is excited by an alternating current from a power supply and control system 48 which may be of any desired design. However, preferably it is in accordance with the teachings of U.S. Pat. No. 4,161,206 to Yarwood et al. In that approach, current in the inductor 46 is controlled in a manner so as to maintain the inductance of the inductor substantially constant. This insures the maintenance of a uniform air gap between the molten surface 16 and the surrounding inductor 46 as a melting run proceeds.

The alternating current in the inductor 46 produces a magnetic field which interacts with the molten surface 16 of thin strip material 12 to produce eddy currents therein. These eddy currents interact with the magnetic field and produce forces which apply a magnetic pressure to the molten surface. The magnetic pressure may contain the molten material until it solidifies, downstream of the inductor, in a desired cross section. The molten surface may be formed or molded in the electromagnetic field of the inductor to correspond to the general shape of the inner periphery of the inductor. The inductor preferably has a rectangularly shaped inner periphery surrounding the molten material in order to obtain the desired thin strip cross section.

Solidification of the molten surface may be achieved by direct application of water or other suitable coolant from the cooling structure 22 to the solidifying surface of the thin strip. In the preferred embodiment, coolant is applied to the solidifying surface by a cooling manifold 70 positioned just downstream of the inductor 46 and in very close proximity therewith. Alternatively, the coolant may be applied to the solidifying surface within the inductor by providing suitable coolant injection slots or ports in the inductor itself.

The apparatus 10 as described above has particular application in the forming of ultra-thin strip from materials such as metalloids including semi-conductive materials such as silicon, germanium, etc. It is also within the scope of the present invention to use any other material such as metals or alloys. Generally, the starting strip thickness may be about 0.1 inches or less and most preferably about 0.040 inches.

Before beginning the process, the coil of starting strip material 12 may be threaded through the input device capstan 34, the upper guide 42, the melting and containment station 14, the coolant application station 22, the lower guide 54, then through the capstan drive 58, and finally onto the takeup reel 61. Obviously, a leader portion of the strip from the inductor 56 to at least the lower capstan drive is not operated on in practice.

In the operation of the present invention, the thin strip 12 enters the inductor 46 and is electromagnetically melted to provide a molten surface layer 16 and a substantially solid core 18. It is quite important in practicing the present invention that the thin material is melted from the surface inward. This is accomplished by providing an inductor of a very high frequency inductance which preferably has a frequency from the kilohertz to the megahertz range. The frequency is chosen so that the penetration depth is a fraction of the total thickness of the thin strip. This results in the heating and melting of the surface, but due to the large heat of fusion of the material, a solid region or core 18 remains in the thin strip. Referring to FIG. 2, it can be appreciated that the time between the L and S of isotherm 17, at constant heat input (from the inductor), can be adjusted so as to achieve the amount of melting desired. In this manner, by carefully balancing energy input and losses, a substantially equal molten zone 16 may be formed around a solid matrix 18. Naturally, this molten zone may extend about the entire surface of the thin strip material located within the zone 14. The thickness of the molten zone determines whether the inductor must also contain and form the melted surface. In the event that the molten zone is very thin, the surface tension may keep the molten material attached to the core. On the other hand, as the molten zone becomes thicker, the molten material could flow or detach from the core and the electromagnetic inductor also has the function of containing and forming the molten surface.

It is proposed, in accordance with the preferred aspect of this invention, that the inductor 46 be powered in a manner so as to not only contain and support the molten surface 16 but so as to also heat the thin strip material in the zone 14 to a temperature at which the surface of incoming strip melts as it is advanced into the melting and containment zone 14. This is accomplished by balancing the pressure and heat input provided by the inductor 46. In order to provide surface melting, the frequency of the applied current may be initially increased. This serves to increase the heating effect of the applied field and the effective resistance of the melt. Once the molten surface is formed, the current can then be reduced and the heat from the molten surface and core (which is preferably at its melting point) acts to heat the thin strip prior to its entering the inductor 46. Obviously, the ability to use the inductor 46 for both heating and containment depends upon the resistivity of the material being cast. In the case of semiconductive type materials such as silicon or germanium, their high resistivity serves to improve the heating effect of the inductor 46. It may not be possible to use the inductor for both containment and heating when comparatively low resistivity materials are employed. However, generally speaking it is usually desired to form ultra-thin strip materials from such high resistivity materials as silicon which find application in semiconductor and electronic devices.

It is an important aspect, when melting and containing ultra-thin strip 12, that the power supply 48 provide a current for the inductor 46 which is at a frequency which is selected such that the penetration depth of the current induced in the molten material 16 is approximately about one-quarter of the thickness of the strip 12' being formed. This results in a solid core comprising approximately 50% of the thickness of the strip. This permits a core with enough thickness to eliminate surface tension and gravity forces. The effect of these forces are more fully described in the patent application to Winter, Ser. No. 158,040. However, it is within the scope of the invention to provide a penetration depth resulting in the solid core being from between approximately 10% to 75% of the thickness of the thin strip.

In selecting the desired penetration depth, note that the penetration depth is given by the following formula:

$$\delta = \sqrt{\rho/\mu_o \pi f}$$

In the above formula $\delta$ = penetration depth. $\delta$ comprises the depth of material in question at which the current is reduced by about 67% as compared to the current at the outer peripheral surface. $\rho$ = the resistivity of the material being cast. $\mu_o$ = the permeability of the material being cast. $f$ = the frequency of the applied current. $\pi = 3.14$.

Penetration depth in accordance with the present invention is defined by the above formula. In accordance with that formula, it will be apparent that as the frequency of the applied current is increased the penetration depth decreases. Thus, the frequency is preferably in the megahertz range to provide the desired penetration depth for the thin strip material of the present invention. In order to maintain adequate shape control required by this invention, by which is meant a uniform shape or cross section over the entire length of the strip being formed, the penetration depth must be carefully controlled by controlling the frequency of the applied current. As mentioned above, the penetration depth is preferably approximately one-quarter or less than the thickness of the strip 12 being formed.

In accordance with the present invention, it is possible to provide a strip 12, after the surface melting operation, which has a desired uniform thickness. This would be beneficial in overcoming the irregularities that occur in the strip pulling process of the type described by Morrison. Further, in strip applications for use in devices such as solar cells, it is desirable to have, if a polycrystalline material is to be provided, large grain size with minimum numbers of grain boundaries and most preferably totally single crystal morphology. The process of the present invention can be controlled to get preferred grain growth. This is accomplished by controlling the thickness of the molten surface of the thin strip material, the temperature gradient created by the coolant application system, the particular mode of cooling and cooling rate, the strain exerted on the core as it is conveyed through the inductor, and the advancement rate of the strip. The process of the present invention provides a directional solidification which results in preferred grain growth. The grain growth proceeds epitaxially on the substantially solid substrate. It is anticipated that the process of the present invention will provide grain growth resulting in regions of large structure preferredness or almost single crystal regions.

The process and apparatus are also capable of thinning the strip material. As described above, strip thinning may be accomplished by adjusting the relative payout and takeup speeds of the incoming and exiting strips at the melting and containment station 46 to stretch out and thin the core 18 while maintaining shape control of the molten surface 16 by electromagnetic containment. The result is a process for forming thin strip material having high dimensional uniformity, smooth surfaces, and preferred crystal structure.

It is further within the scope of the invention to provide a heating device which heats only one surface of the thin strip material. Then, one surface of the strip material is molten and the other surface remains solid. In certain applications this may be preferable and more economical to operate.

A second embodiment of the present invention is concerned with a process for restructuring thin strip semi-conductor material while it remains in the solid state. The process includes the steps of providing relative movement between the thin strip material and a heating station; then, heating the thin strip material at the heating station to a desired temperature between the recrystallization temperature and the melting temperature; next, maintaining the strip at the desired temperature until preferred recrystallization and stress relief occurs within the material. This process can significantly improve the electrical characteristics of the restructured material when it is used in applications such as semi-conductor or photovoltaic.

During the casting of the ribbon or strip of semi-conductor material, high stresses are frequently introduced by the thermal or solidification forces. These thermal stresses can result in fracture, thermal buckling, grain boundaries in non-equilibrium configurations, and irregular crystal structure. Semi-conductor strip having thermal stress, non-equilibrium grain boundaries, and irregular crystal structure may have electrical characteristics and other mechanical properties of a substantially lower value than required for many semi-conductor and photovoltaic applications.

The present invention provides a process whereby electrical and mechanical properties of the strip may be significantly improved by simply heating solid state strip to temperatures in excess of the recrystallization temperature for the particular material. By heating within the solid state and in an appropriate atmosphere, stress relief occurs autogeneously where atomic mobility can occur (i.e. 800° C. for silicon). At this temperature, atomic mobility permits the crystals to begin altering their shape as they go to the lowest energy state. This process may occur at a faster rate if the temperature is increased until it reaches a maximum value of the melting temperature (approximately 1430° C. for silicon). Recrystallization, likewise, occurs if the grain boundaries are in their non-equilibrium condition. The grain boundaries obey surface tension laws and within thin, ribbon-like materials, initially strive to migrate in the short transverse direction of the strip to generate substantially single crystal structure through the transverse cross section or thickness of the strip. With increased time, the grain boundaries begin to migrate in the width and length of the strip to form short, straight grain boundaries. If the strip is under tension or has been critically deformed, enhanced grain boundary mobility is achieved over and above the aforementioned equilibrium state and true single crystalline ribbon or strip may result. Although this secondary recrystallization or grain growth mechanism is well known to occur in metallic materials, it is not believed to have been disclosed as a means for enhancing the behavior of polycrystalline, thin, semi-conductor type ribbon.

Another important aspect of the present invention is the ability to elongate the thin strip material through the activation of the matrix slip or grain boundary sliding mechanisms. As described above, when the temperature reaches the point where the matrix slip systems are activated (the atoms move) or the grain boundary sliding (whole families of atoms move) is possible, then extension of the strip by application of external tensile forces is thought to be possible. While in the case of the matrix slip it is thought that there will be very rapid extension of the strip, grain boundary sliding appears to be more time related and, therefore, may require an extended period of heating at the desired temperature within the heating station. The resultant stretch forming of the thin strip yields elongated strip which has been thinned by the requirement for constancy of volume. Thus, with this mechanism available, cast strip material formed at gages in excess of those desired may be thinned with solid state thinning as described herein.

The advantage to working the thin strip at lower temperatures is the substantial prevention of the introduction of high thermal stresses while forming restructured thin strip with desirable grain boundaries and regular crystal structure to provide enhanced mechanical and electrical properties. In addition, the lower temperature allows for more economical and efficient operation requiring less critical controls.

Figure 4:
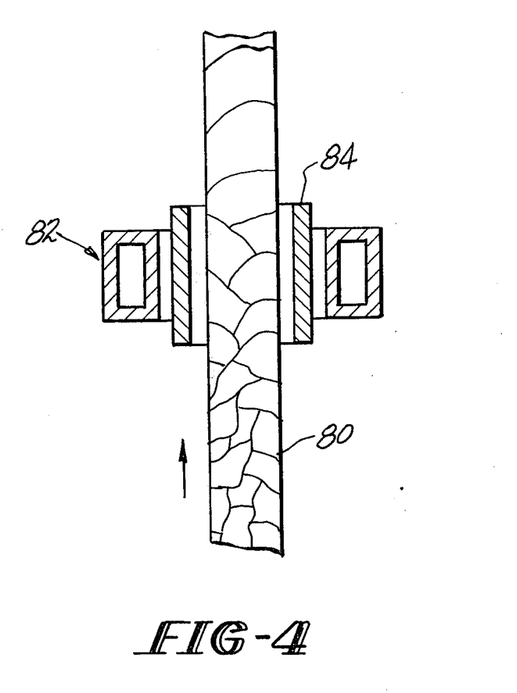
FIG. 4 is a representation of a thin strip of material passing through an electromagnetic heating device in accordance with a second embodiment of the invention.

The apparatus required to perform the process of restructuring thin strip semi-conductor material while it is in its solid state may be substantially identical to the apparatus of FIG. 1 described hereinabove. The primary difference exists in the temperature to which the strip is heated at heating station 82 which is illustrated in FIG. 4. Accordingly, only a brief description of the apparatus of FIG. 1 is described hereinbelow in order to clarify its relationship with the heating station 82 as well as other additions which may be required.

The process is preferably performed within a controlled atmosphere to reduce the possibility of contamination. If desired, a processing chamber 24 may be provided to encompass all of the strip being processed. The starting thin strip material may be supported on a payoff reel and threaded through a capstan drive 34, a guide device 42, the heating station 82, a coolant spraying manifold 52, a second guide device 54, a second capstan drive 58, and finally back onto a takeup reel 61. Also, a device 20 provides relative movement between the thin strip and the heating station 82. The device 20 controls both the speed which the strip 80 moves through the heating station as well as the longitudinal tension on the strip.

The heating station 82 preferably uses induction heating to maintain a substantially constant temperature through the thin strip for a desired period of time while the strip is traveling through the heating station. In order to achieve efficient heating from the inductor, a susceptor device 84 is required between the inductor and the thin strip. The susceptor is coupled with the electromagnetic field of the inductor and heated by the inductive current created therein. This heat is transferred to the strip of silicon by a combination of heat conduction and radiation. The susceptor may be positioned between the inductor and the strip until the strip reaches an approximate temperature of 800° C. At this point, the susceptor 84 may be removed if desired in accordance with the principles set forth in U.S. patent application Ser. No. 178,063 filed Aug. 14, 1980 to Yarwood et al. In that application, there are set forth various susceptor structures any of which may be incorporated herein. Although the induction heating is preferred, it is within the scope of the present invention to use any other heating process to deliver direct heat flux such as for example, a plasma arc, direct radiation, lasers or electronic beams.

In addition, if desired an additional heating source may be provided directly upstream from the heating station 82 to heat the strip up to a temperature close to the recrystallization temperature. This additional heating source may be provided by another inductor, a laser, or any other desired heat input system.

After the strip leaves the heating station 82, it is important to control the cooling rate of the strip in order to prevent the formation of thermal stress and to enhance the continued growth of equilibrium grain boundaries and regular crystal structure. The cooling rate of the strip may be partially controlled by the insulation effect of the controlled atmosphere. In addition, if desired, other measures such as reflective mirrors (not shown) may be placed around the strip directly downstream from the heating station 82 to more carefully control the cooling rate. Also, as illustrated in FIG. 1, a coolant spray manifold 52 may also be provided downstream from the heating station in order to further cool the strip with a coolant material such as for example, argon gas. The remainder of the apparatus adapted to carry out the process of the present invention has been described in greater detail hereinabove and should be referred to as required. This apparatus has particular application in the forming of ultra-thin strip from materials such as metalloids which include semi-conductive materials such as silicon, germanium, etc. Generally, the starting strip thickness may be about 0.1" or less and most preferably about 0.040".

In order to more fully understand the present invention, a description of the process for restructuring thin strip semi-conductor material is provided. First, the heating station 82 may be operated with the susceptor 84 in place whereby the strip is heated to the desired temperature. At this point, the susceptor may be removed and the inductor will continue to maintain the heat in the strip while the heat effects the incoming strip to bring it up to the required temperature. Also, if desired, preheating of the strip may have occurred upstream from the heating station. Then, relative movement is provided between the thin strip material and the heating station. The relative movement is provided by conveying the strip material at a first desired speed to the heating station and at a second desired speed away from the heating station. In the event that longitudinal tension is desired to be maintained on the thin strip, the second desired speed is greater than the first desired speed.

The temperature to which the semi-conductor material is heated is between the recrystallization temperature and the melting temperature. In the case of silicon, the desired temperature is between approximately 800° C. and 1430° C. and preferably between 1000° C. and 1350° C. Of course, the desired temperature is closely dependent upon the material being worked and the required amount of stress relief, crystal, and grain reorientation.

The relative speed at which the strip of material passes through the heating station is extremely important. This is due to the requirement of maintaining the strip at the desired temperature whereby the preferred recrystallization and stress relief occurs in the material. Specifically, by maintaining the strip at the desired temperature, epitaxial growth of a substantially single crystal through the transverse cross section of the thin strip material may occur. Also, by maintaining the strip at the desired temperature, substantially short, straight grain boundaries are formed in the width and length of the strip. The external force created by the longitudinal tension place on the strip by the device for providing relative movement enhances the tendency of the crystal structure to move into a state of equilibrium and the grain boundaries to become mobile and also move to their lowest thermodynamic energy level. If the temperature of the strip is maintained at a suitable level for a required amount of time, enhanced grain boundary mobility is achieved and true signal crystalline ribbon or strip may be constructed.

In the event that the strip requires some controlled thinning, by elevating the temperature of the strip, the matrix slip or grain boundary sliding mechanism may be activated to allow for some increase in length and due to the constancy of volume, a corresponding decrease in thickness. Also, the strip may be elongated by increasing the longitudinal tension on the thin strip either alone or in conjunction with the elevation of the temperature to lengthen the thin strip by the same techniques of activating the matrix slip or grain boundary sliding mechanism. The matrix slip or movement of atoms in the crystal occurs very rapidly and provides a very quick extension of the material. On the other hand, grain boundary sliding is more time dependent and may require the strip to be maintained at the desired temperature for a longer period of time. The result is a process for forming thin strip material having high dimensional uniformity and preferred crystal structure.

While the invention has been described generally by reference to semi-conductor materials, it may also be adapted for use with various metals and alloys, including steel, nickel, aluminum, copper and combinations thereof although other metals and alloys are not intended to be excluded. While the invention has been described with respect to the treatment of metalloids and semi-metals such as silicon or germanium, it is applicable to a wide range of such semi-metals including sapphire and compound semi-conductive materials such as galliumarsenide or the like. These materials are mentioned by way of example, and it is not intended to exclude other metalloids or semi-metal type materials. Further, the materials may be doped or undoped as desired.

While the strip of the first embodiment is shown as moving past a fixed melting and containment station 14 and a heating station 82 for the second embodiment, if desired the strip could be fixed and the stations 14 or 82 moved.

While the strip of both embodiments has been described as moving downwardly, it can be moved in any desired direction. In addition, while vertical movement of the strip is preferred, the strip may be arranged to move along any desired orientation. Should multiple passes of the strip through the apparatus be desired, then a reversing arrangement in the thickness controller is possible whereby the strip is first moved in one direction, e.g. downward and after completing the pass is reversed by reversing motors 18 and 28 to move upward and then reversed again as desired.

The U.S. patents set forth in this application are intended to be incorporated by reference herein.

It is apparent that there has been provided in accordance with this invention a process and apparatus for forming thin strip material which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A process for restructuring a solid state thin strip semi-conductor material comprising the steps of:
   a. providing a heating station;
   b. conveying said solid state thin strip to said heating station at a first desired speed;
   c. heating said solid state thin strip material in said heating station to a desired temperature above the recrystallization temperature and below the melting temperature;
d. maintaining said desired temperature in said solid state thin strip as said strip passes through said heating station for simultaneously recrystallizing and relieving stress within said thin strip;
e. placing longitudinal tension on said thin strip to activate the recrystallization and stress relief within said thin strip; and
f. conveying restructured solid state thin strip material from said heating station at a second desired speed greater than said first desired speed for placing the longitudinal tension on said thin strip.

2. The process of claim 1 wherein said heating occurs substantially uniformly in the strip.

3. The process of claim 1 wherein said semi-conductor material is silicon and said desired temperature is between approximately 800° C. and 1430° C.

4. The process of claim 3 wherein said desired temperature is preferably between approximately 1000° C. and 1350° C.

5. The process of claim 1 including the step of: preheating the strip upstream of the heating station.

6. The process of claim 5 including the step of: providing an electromagnetic heating apparatus at said heating station.

7. The process of claim 6 further including the step of: providing a controlled atmosphere wherein the strip is heated.

8. The process of claim 1 wherein said step of recrystallizing and relieving stress within said strip includes epitaxially growing a substantially single crystal through the transverse cross section of the thin strip material.

9. The process of claim 8 wherein said step of epitaxially growing includes forming substantially short, straight grain boundaries in the width and length of said strip.

10. The process of claim 1 including the step of: elongating the thin strip material through elevating the temperature of the strip above said desired temperature to activate matrix slip or grain boundary sliding mechanism.

* * * * *